US011063603B1

(12) United States Patent
Vyas

(10) Patent No.: US 11,063,603 B1
(45) Date of Patent: Jul. 13, 2021

(54) PHASE ALIGNMENT OF CT-MASH CONVERTER

(71) Applicant: Analog Devices International Unlimited Company, Limerick (IE)

(72) Inventor: Bhargav R. Vyas, Bangalore (IN)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 16/915,378

(22) Filed: Jun. 29, 2020

(51) Int. Cl.
| | |
|---|---|
| *H03M 1/12* | (2006.01) |
| *H03M 3/00* | (2006.01) |
| *H03M 1/16* | (2006.01) |
| *H03M 1/06* | (2006.01) |
| *H03M 1/10* | (2006.01) |

(52) U.S. Cl.
CPC .......... *H03M 3/414* (2013.01); *H03M 1/0626* (2013.01); *H03M 1/167* (2013.01); *H03M 3/464* (2013.01); *H03M 1/06* (2013.01); *H03M 1/1009* (2013.01); *H03M 1/12* (2013.01)

(58) Field of Classification Search
CPC .................................. H03M 1/12; H03M 1/06
USPC .................. 341/155, 118, 120, 119, 126
See application file for complete search history.

(56) References Cited

U.S. PATENT DOCUMENTS

| | | | |
|---|---|---|---|
| 4,890,107 A | 12/1989 | Pearce | |
| 8,649,528 B2 * | 2/2014 | Furst | H04R 19/04 |
| | | | 381/91 |
| 9,178,529 B2 | 11/2015 | Dong et al. | |
| 9,614,510 B2 | 4/2017 | Srinivasan et al. | |
| 2005/0275576 A1 * | 12/2005 | Fudge | H03M 1/0626 |
| | | | 341/155 |
| 2011/0095924 A1 * | 4/2011 | Lee | H03M 3/356 |
| | | | 341/143 |

OTHER PUBLICATIONS

Dong, Yunzhi, et al., "A Continuous-Time 0-3 MASH ADC Achieving 88 dB DR With 53 MHz BW in 28 nm CMOS", IEEE Journal of Solid-State Circuits, 49(12), (Dec. 2014), 2868-2877.
Gharbiya, Ahmed, et al., "A 12 bit 3.125 MHz Bandwidth 0-3 MASH Delta-Sigma Modulator", IEEE Journal of Solid-State Circuits, 44(7), (Jul. 2009), 2010-2018.

* cited by examiner

*Primary Examiner* — Joseph J Lauture
(74) *Attorney, Agent, or Firm* — Schwegman Lundberg & Woessner, P.A.

(57) ABSTRACT

A multistage noise shaping (CT-MASH) converter with phase alignment is provided. The CT-MASH converter may include a prefilter, an auxiliary path with an adjustable continuous time sigma delta converter (CTSD), and a modulator. The adjustable CTSD may provide phase alignment using one or more of a variety of techniques, such as modifying a group-delay of the CTSD by tuning a feedforward coefficient, by tuning an excess loop delay coefficient, and/or by adjusting a clock timing of the CTSD.

24 Claims, 9 Drawing Sheets

PHASE ALIGNMENT OF CT-MASH CONVERTER

TECHNICAL FIELD

The present disclosure generally relates to continuous time multistage noise shaping (CT-MASH) converters and techniques for aligning phases of signals associated with CT-MASH converters.

BACKGROUND

CT converters provide high speed operations; hence, they are gaining popularity in a variety of applications, such as communication, data-acquisition, and instrumentation applications. CT-MASH converters are a type of CT converters. CT-MASH converters typically include a cascade of different stages. This cascade approach can simplify the design of the CT converter while providing advantages such as low-power design or higher noise-shaping. Some types of CT-MASH converters can also include filtering and signal cancellation components.

But these MASH components can suffer from phase misalignment. For example, filters can be subject to process variations, which can affect phases of the filtered signals. Trimming or tuning a filter to lessen the process variations, however, can introduce unwanted distortion in the CT-MASH converter. Other techniques for aligning phases in a CT-MASH converter are overly complex, requiring high power and large circuit area, diminishing the advantages a CT-MASH converter can provide.

BRIEF DESCRIPTION OF THE DRAWINGS

Various ones of the appended drawings merely illustrate example embodiments of the present disclosure and should not be considered as limiting its scope.

DETAILED DESCRIPTION

The inventor recognized a need in the art for phase alignment techniques in a MASH converter, which are low power and low area.

This document describes a MASH converter with phase alignment. The MASH converter may include a prefilter to filter an input signal to generate a filtered signal. The MASH converter may also include an auxiliary path to generate a cancellation signal, the auxiliary path including an adjustable continuous time sigma delta (CTSD) converter for aligning a phase of the cancellation signal with a phase of the filtered signal. Further, the MASH converter may include a summing node to generate a residue signal based on a difference of the filtered signal and the cancellation signal, and a modulator to quantize the residue signal and to generate an output signal.

This document also describes a method of converting an analog signal to a digital signal. The method may include filtering the analog signal to generate a filtered signal; generating a cancellation signal for phase alignment with the filtered signal; subtracting the cancellation signal from the filtered signal to generate a residue signal; and modulating the residue signal to generate the digital signal.

This document also describes method of tuning a MASH converter. The method may include providing a resistor capacitor (RC) filter in a prefilter path; providing an auxiliary path coupled to the prefilter path by a summer node; providing a modulator coupled to the summer node; measuring variations of the RC filter; and based on the measured variances, adjusting a continuous time sigma delta (CTSD) converter provided in the auxiliary path for aligning phase responses of the prefilter and auxiliary paths.

Figure 1:
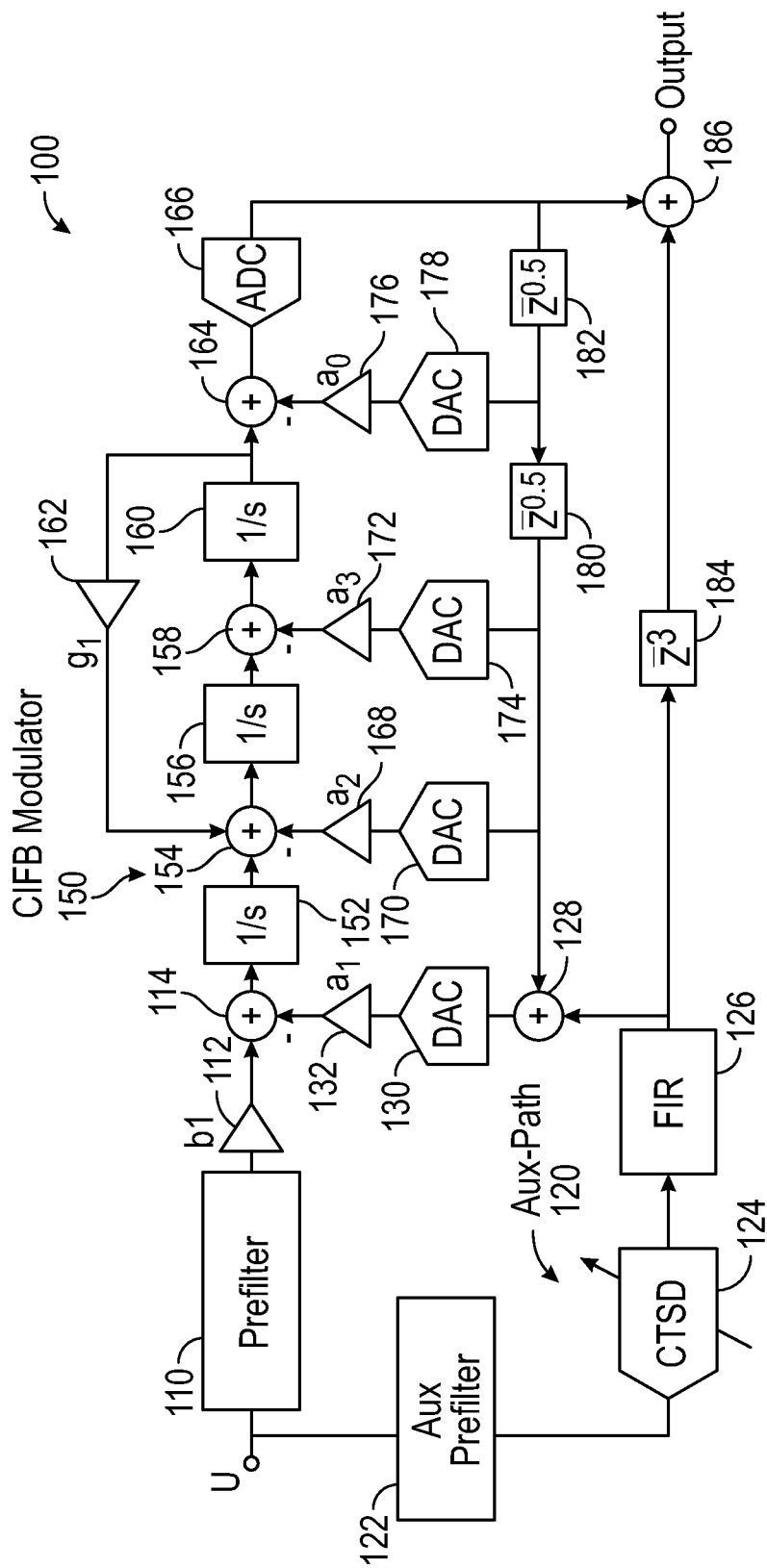
FIG. 1 illustrates a CT-MASH converter with phase alignment.

FIG. 1 illustrates an example of portions of a CT-MASH converter 100 with phase alignment. The CT-MASH converter 100 includes three circuit stages: a prefilter 110, an auxiliary path 120, and a cascade-of-integrators with feedback (CIFB) modulator 150. An input signal U may be received by the prefilter 110 and the auxiliary path 120. The prefilter 110 may be provided as a low pass filter and may include resistive and capacitive elements, such as a resistor-capacitor (RC) filter, such as may be provided on a monolithic integrated circuit. The prefilter 110 may be defined by its poles and zeros; for example, the prefilter 110 may include three poles and one zero. As discussed above, the prefilter 110 may suffer from process variations.

The prefilter 110 may filter the input signal U to generate a filtered signal. The prefilter 110 may scale the input signal using a b1 input coefficient 112. The scaled filtered signal may then be provided as an input to a summing node 114 of a first integrator.

The auxiliary path 120 may also receive the input signal U and may generate a cancellation signal in an opposite polarity as the filtered signal; the cancellation signal may be provided as another input to the summing node 114. Thus, the summing node 114 may generate a residue signal, which is the difference of the filtered signal and the cancellation signal. The CIFB modulator 150 may then quantize the residue signal and generate an output signal. Because the residue signal is the difference of the filtered signal and the cancellation signal, the residue signal may include minimal signal content and quantization noise to be converted. Thus, the CIFB modulator 150 may be provided as a low power modulator with a relaxed linear specification and swing because, for example, the quantization noise is uncorrelated to the signal and smaller in magnitude as compared to the signal.

The auxiliary path may include an auxiliary prefilter 122, an adjustable continuous time sigma delta (CTSD) converter 124, a digital finite impulse response (FIR) filter 126, and a digital summer 128. The auxiliary prefilter 122 may include resistive and capacitive elements, such as a RC filter, such as may be provided on a monolithic integrated circuit. The auxiliary prefilter 122 may include fewer poles than the prefilter 110 (e.g., 1 pole in auxiliary prefilter 122 as compared to 3 poles in prefilter 110). The auxiliary prefilter 122 may filter the input signal U.

Phases of the filtered signal (from the prefilter 110) and cancellation signal may be aligned by the auxiliary path 120, namely using the adjustable CTSD 124. The adjustable CTSD 124 may convert the input signal to a digital cancellation signal. During the conversion, the adjustable CTSD 124 may also align the phases of the cancellation signal to the phase of the filtered signal. As explained below in further detail, the adjustable CTSD 124 may be adjustable in that it may provide phase alignment using one or more of a variety of techniques, such as modifying a group-delay of the CTSD by tuning a feedforward coefficient, by tuning an excess loop delay coefficient, and/or by adjusting a clock timing of the CTSD.

The CTSD 124 may be coupled to the digital FIR filter 126 to provide digital filtering of the digital cancellation signal. The output of the digital FIR filter 126 may be coupled to the digital summer 126, which combines the output of the digital FIR filter 126 with a signal from the CIFB modulator 150 such as with delays 180, 182. The output of the digital summer 128 may be converted to an analog signal by DAC 130. The DAC 130 may scale the feedback, represented by an a1 input coefficient 132, which in turn may be coupled to an inverting input of the summing node 114, so that the cancellation signal generated by the auxiliary path 120 is provided in an opposite polarity as the filtered signal generated by the prefilter 110.

The summing node 114 may generate the residue signal by taking the difference of the filtered signal and the cancellation signal. The CIFB modulator 150 may then quantize the residue signal. The CIFB modulator 150 may include a plurality of integrators 152, 156, 160; summing nodes 154, 158, 164; a g1 coefficient 162, an analog-to-digital converter (ADC) 166; feedback paths with DACs 130, 170, 174, 178 and input coefficients a1, a2, a3, a0 (132, 168, 172, 176). As explained above, the output of the ADC 166 may be coupled to the digital summer 128 in the auxiliary path 120 such as via delays 180, 182. The output of the ADC 166 may be combined with the output of the digital FIR filter 126 by the digital summer 186 to generate an output signal of the CT-MASH converter 100.

Tuning the group-delay of the CTSD 124 may help provide proper phase alignment across frequencies within the bandwidth of interest of the CT-MASH converter 100. Moreover, the CT-MASH converter 100 is depicted as a 1-3 order MASH converter in FIG. 1, where "1" corresponds to the one CTSD 124 provided in the auxiliary path 120 and "3" corresponds to the third order noise shaping property realized by the three integrators 152, 156, 160 provided in the CIFB modulator 150, for illustration purposes only; different order MASH converters may be provided.

Figure 2:
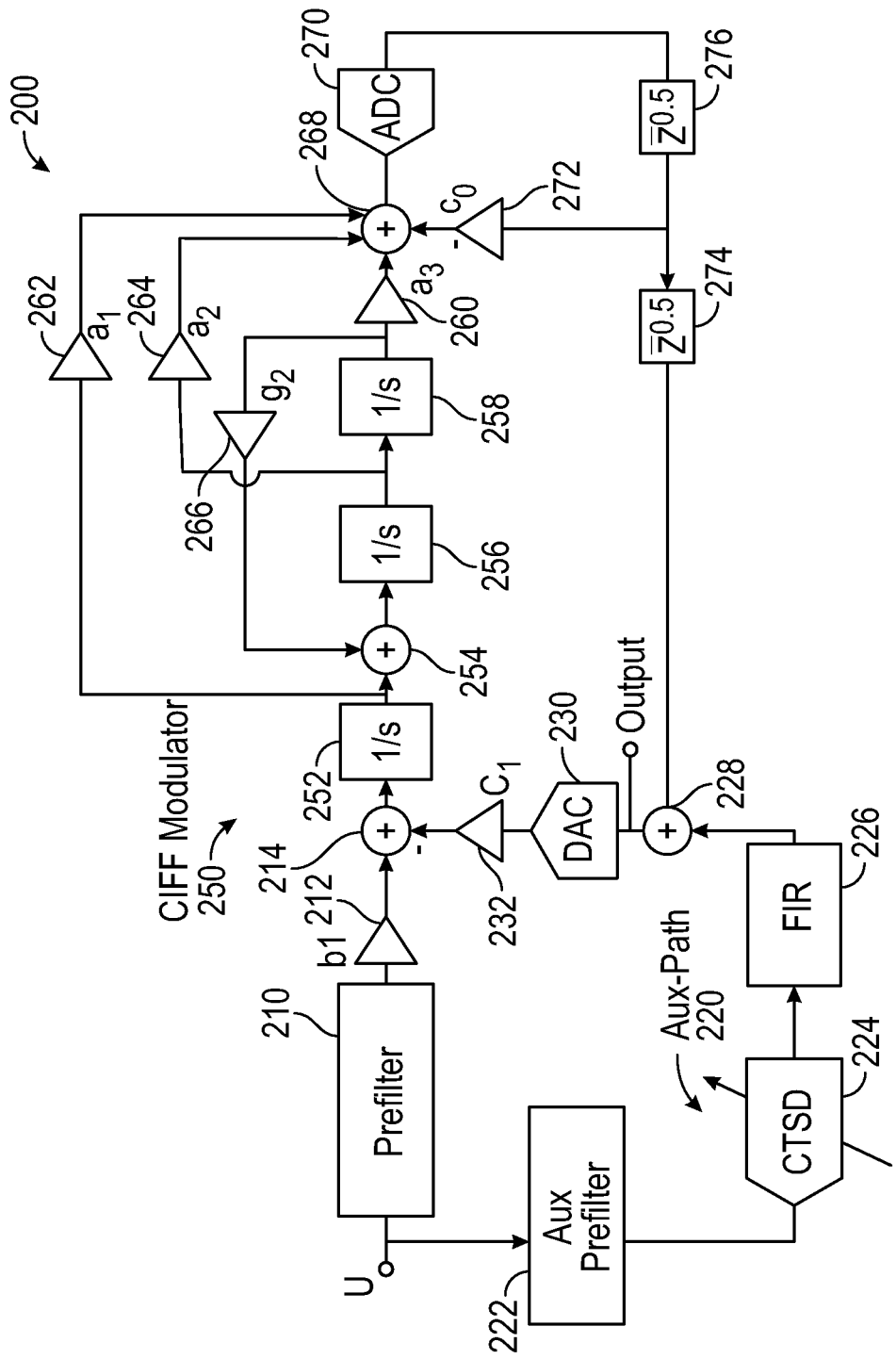
FIG. 2 illustrates a CT-MASH converter with phase alignment.

The phase alignment techniques described herein may also be implemented in MASH converters with cascade-of-integrators with feedforward (CIFF) modulators. FIG. 2 illustrates an example of portions of a CT-MASH converter 200 with phase alignment. The CT-MASH converter 200 includes three circuit stages: a prefilter 210, an auxiliary path 220, and a CIFF modulator 250. An input signal U may be received by the prefilter 210 and the auxiliary path 220. The prefilter 210 may be provided as a low pass filter and may include resistive and capacitive elements, such as a RC filter, such as may be provided on a monolithic integrated circuit. The prefilter 210 may be defined by its poles and zeros; for example, the prefilter 210 may include three poles and one zero. As discussed above, the prefilter 210 may suffer from process variations.

The prefilter 210 may filter the input signal U to generate a filtered signal. The prefilter 210 may scale the input signal using a b1 input coefficient 212. The scaled filtered signal may then be provided as an input to a summing node 214.

The auxiliary path 220 may also receive the input signal U and may generate a cancellation signal in an opposite polarity as the filtered signal; the cancellation signal may be provided as another input to the summing node 214. Thus, the summing node 214 may generate a residue signal, which is the difference of the filtered signal and the cancellation signal. The CIFF modulator 250 may then quantize the residue signal and generate an output signal. Because the residue signal is the difference of the filtered signal and the cancellation signal, the residue signal may include minimal signal content and quantization noise to be converted. Thus, the CIFF modulator 250 may be provided as low power modulator with a relaxed linear specification and swing because, for example, the quantization noise is uncorrelated to the signal and smaller in magnitude as compared to the signal.

The auxiliary path may include an auxiliary prefilter 222, an adjustable CTSD converter 224, a digital FIR filter 226, and a digital summer 228. The auxiliary prefilter 222 may include resistive and capacitive elements, such as a RC filter, such as may be provided on a monolithic integrated circuit. The auxiliary prefilter 222 may filter the input signal U.

Phases of the filtered signal (from the prefilter 210) and cancellation signal may be aligned by the auxiliary path 220, namely the adjustable CTSD 224. The adjustable CTSD 224 may convert the input signal to a digital cancellation signal. During the conversion, the adjustable CTSD 224 may also align the phases of the cancellation signal to the phase of the filtered signal. As explained below in further detail, the adjustable CTSD 224 may provide phase alignment using one or more of a variety of techniques, such as modifying a group-delay of the CTSD by tuning a feedforward coefficient, by tuning an excess loop delay coefficient, and/or by adjusting a clock timing of the CTSD.

The CTSD 224 may be coupled to the digital FIR filter 226 to provide digital filtering of the digital cancellation signal. The output of the digital FIR filter 226 may be coupled to the digital summer 226, which combines the output of the digital FIR filter 226 with a signal from the CIFF modulator 250 with delays 274, 276. The output of the digital summer 228 may be converted to an analog signal by DAC 230. The DAC 230 may be followed by a c1 input coefficient 232, which in turn may be coupled to an inverting input of the summing node 214, so that the cancellation signal generated by the auxiliary path 220 is provided in an opposite polarity as the filtered signal generated by the prefilter 210.

The summing node 214 may generate the residue signal by taking the difference of the filtered signal and the cancellation signal. The CIFF modulator 250 may then quantize the residue signal. The CIFF modulator 250 may include a plurality of integrators 252, 256, 258; summing nodes 254, 268; feedforward paths with input coefficients a1, a2 (262, 264); input coefficient g2 266; an ADC 270; input coefficient c0 272, the DAC 230, and the input coefficient c1 232. As mentioned above, the output of the ADC 270 may be coupled to the digital summer 228 via delays 274, 276. The digital summer 228 may generate an output signal of the CT-MASH converter 200.

Tuning the group-delay of the CTSD 224 may help provide proper phase alignment across frequencies within the bandwidth of interest of the CT-MASH converter 200. Moreover, the CT-MASH converter 200 is depicted as a 1-3 order MASH converter, where "1" corresponds to the one CTSD 224 provided in the auxiliary path 220 and "3"

corresponds to the third order noise shaping property realized by the three integrators 252, 256, 258 provided in the CIFF modulator 250, for illustration purposes only; different order MASH converters may be provided.

The CTSD in the auxiliary path may be tuned such as based on the effect of the process variations associated with the prefilter of the MASH converter. As discussed above, the prefilter may include RC components subject to process variations. Those variations may be detected or measured and, based on the detected or measured variations, the CTSD may be tuned accordingly such as to help align the phases of the corresponding signals. As discussed below, the CTSD may be tuned one time, i.e., calibrated, at the time of manufacturing. Additionally or alternatively, the prefilter response may be measured during operation of the MASH converter, and the adjustable CTSD may be dynamically tuned during operation such as over a useful life of the part.

Figure 3:
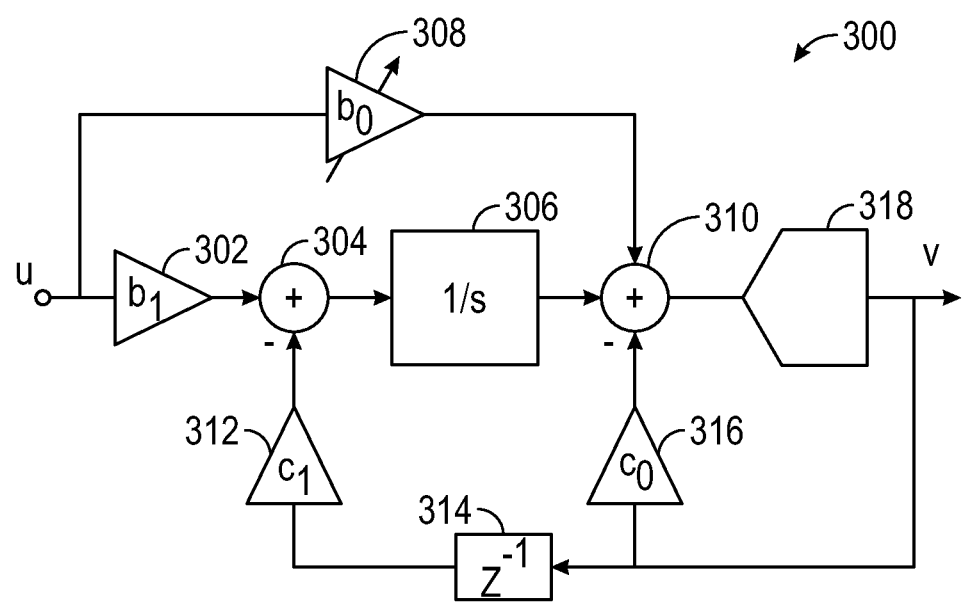
FIG. 3 illustrates an adjustable continuous time sigma delta (CTSD) for phase alignment.

FIG. 3 illustrates an example of portions of an adjustable CTSD 300 such as for phase alignment. The adjustable CTSD 300 may be provided in an auxiliary path of a MASH converter, such as described above, and includes an adjustable feedforward coefficient b0. The adjustable CTSD 300 may receive an input signal U (which may be filtered by an auxiliary prefilter) and convert the input signal to digital cancellation signal V. During the conversion, the adjustable CTSD 300 may also adjust the phase of the cancellation signal such as by tuning a group-delay of the CTSD 300 to align with the phase of the filtered signal from a prefilter of a MASH converter.

The adjustable CTSD 300 may include a main path, such as which includes an input coefficient b1 302, summing nodes 304, 310, an integrator 306, and a quantizer 318; a feedforward path, such as which includes an adjustable feedforward coefficient b0 308; and a feedback path, such as which includes a feedback coefficient c1 312, a delay 314, and an excess loop delay (ELD) coefficient c0 316.

The adjustable feedforward coefficient b0308 may be tuned, which in turn tunes the group-delay for phase alignment. Hence, adjusting b0 modifies the group-delay and thus the phase response of the CTSD 300. But adjusting b0 does not impact the magnitude response of the CTSD 300, nor does adjusting b0 impact the noise transfer function (NTF) of CTSD 300.

The NTF of CTSD 300 may be represented as:

$$NTF(z) = \frac{1 - z^{-1}}{1 + (c0 - 1)z^{-1} + (c1 - c0)z^{-2}}$$

As shown, the NTF of CTSD 300 is not defined by b0. The loss function L(s) may be represented as:

$$L(s) = b0 + \frac{b1}{s}$$

And the signal transfer function of CTSD 300 may be represented as:

STF(s)=L(s)NTF(z)

Hence, adjusting the feedforward coefficient b0 modifies the phase of the STF, but does not change the overall magnitude response (i.e., gain) in-band, which is driven by the main path including input coefficient b1 302.

The various summing nodes and scaling coefficients described herein can be implemented using circuitry, such as can include one or more amplifier or attenuator scaling circuits, an arithmetic logic unit, or other circuitry. For example, the feedforward coefficient b0 may be provided as a variable resistor that can be tuned based on, for example, measured variations of a MASH converter's prefilter.

Figure 4:
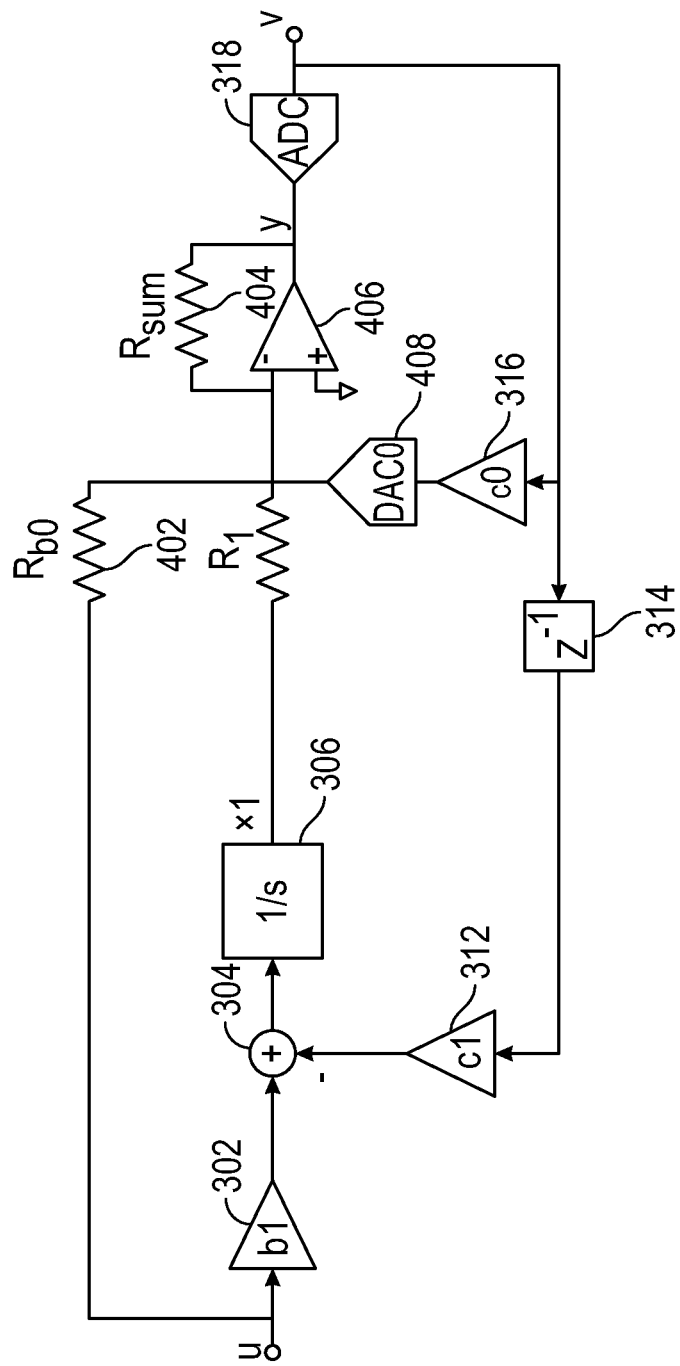
FIG. 4 illustrates a CTSD with an adjustable feedforward coefficient.

FIG. 4 illustrates an example of portions of an adjustable CTSD 300 with an adjustable feedforward coefficient. Here, the adjustable feedforward coefficient b0 308 may include a variable resistor Rb 402, a feedback resistor Rsum 404, and an active summer 406 (and a DAC 408). The variable resistor Rb 402 may be coupled to a first terminal of the active summer 406 (along with resistor R1) and the feedback resistor Rsum 404, which is also coupled to the output, y, of the active summer 406 in a feedback fashion. The second terminal of the active summer 406 may be coupled to ground.

The value of the feedforward coefficient b0 may be represented as:

$$b0 = -\frac{Rsum}{Rbo}$$

Accordingly, adjusting the resistance of the variable resistor Rb 402 may modify the value of the feedforward coefficient b0.

Figure 5:
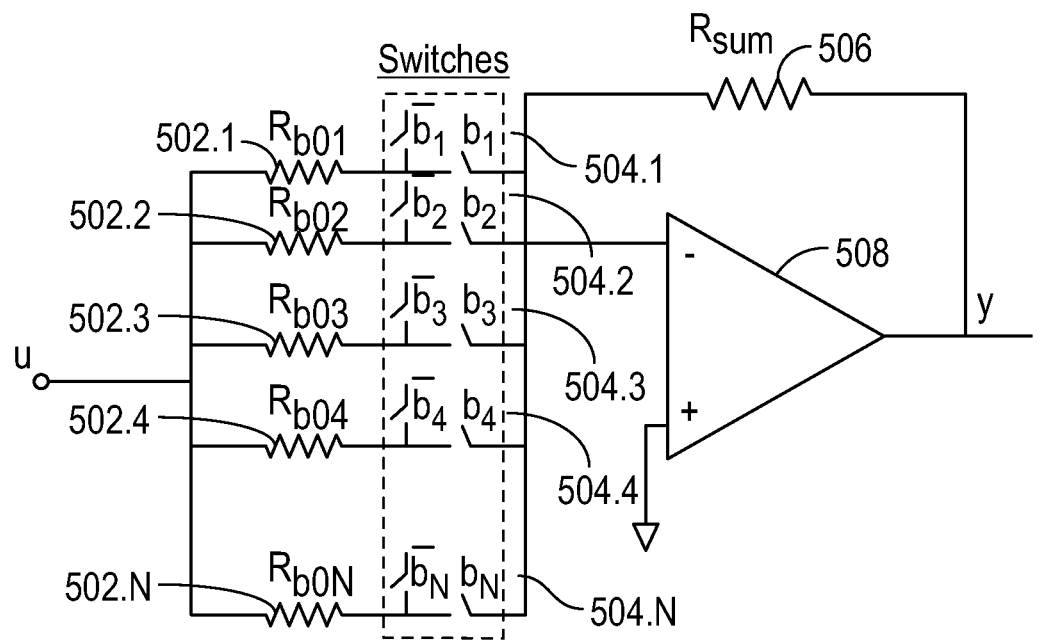
FIG. 5 illustrates an adjustable feedforward coefficient.

FIG. 5 illustrates an example of portions of an adjustable feedforward coefficient b0. Here, Rb may be provided as a network of resistors Rb01-Rb0N (502.1-502.N) and a network of switches $\overline{b1}$, b1-$\overline{bN}$, bN (504.1-504.N) coupled to a first terminal of the active summer 508 and the feedback resistor Rsum 506, which is also coupled to the output, y, of the active summer 508 in a feedback fashion. The second terminal of the active summer 508 may be coupled to ground. The network of resistors Rb01-Rb0N (502.1-502.N) may be provided as an array of unit resistors, and the network of switches $\overline{b1}$, b1-$\overline{bN}$, bN (504.1-504.N) may be set (or trimmed) to achieve the desired value of Rb0 and thus the desired value of the feedforward coefficient b0.

Figure 6:
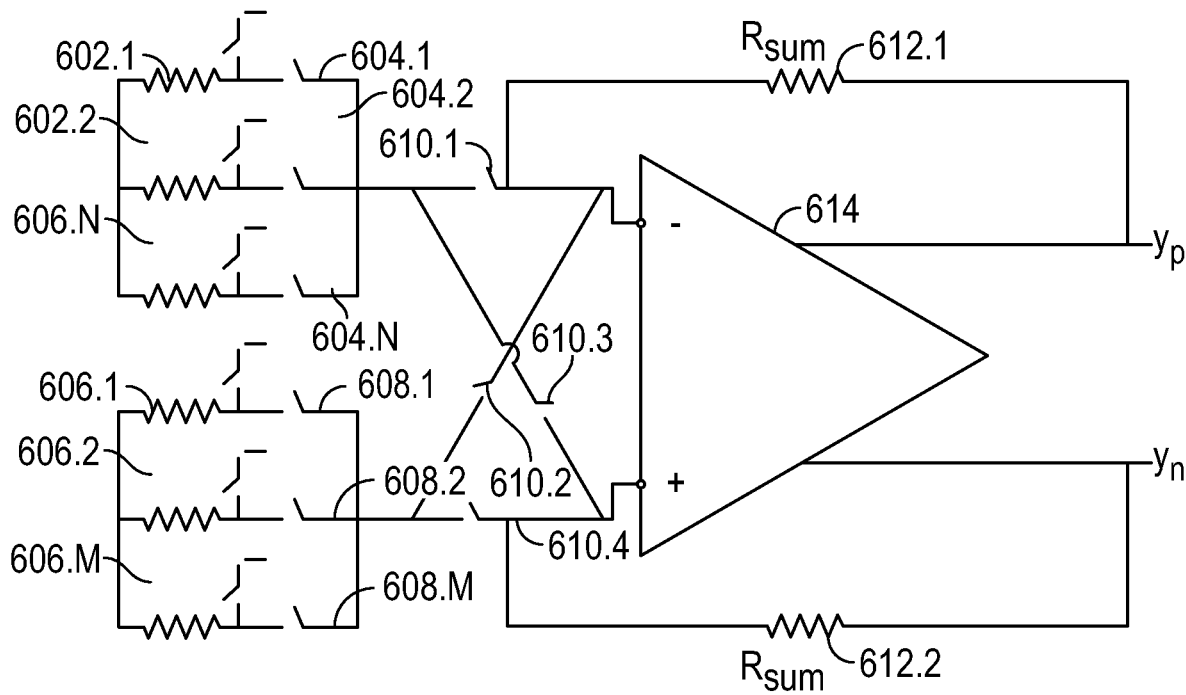
FIG. 6 illustrates an adjustable feedforward coefficient in differential implementation.

FIG. 6 illustrates an example of portions of an adjustable feedforward coefficient b0 in a differential implementation. Here, Rb0 may be provided as two network of resistors 602.1-602.N, 606.1-606.N and two network of switches 604.1-604.N, 608.1-608.N, which may be selectively coupled to either of terminals active summer 614 by switches 610.1-610.4. The feedback resistors Rsum 612.1, 612.2 may be coupled to the networks of resistors and switches and the output of the active summer 614. The network of resistors 602.1-602.N, 606.1-606.N may be provided as arrays of unit resistors, and the network of switches 604.1-604.N, 608.1-608.N may be set (or trimmed) to achieve the desired value of Rb0 and consequently the desired value of the feedforward coefficient b0. Moreover, the differential implementation may help in reversing polarity of the feedforward coefficient b0 for phase alignment, if needed. The polarity may be set using switches 610.1-610.4; for example, switches 610.1 and 610.4 may set the polarity of b0 to positive, and switches 610.2 and 610.3 may set the polarity of b0 to negative.

Figure 7:
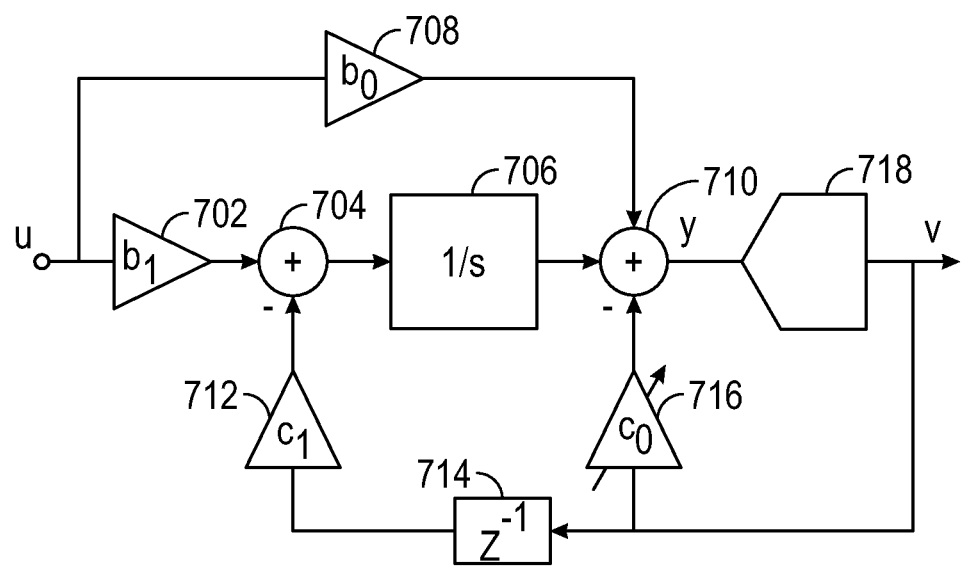
FIG. 7 illustrates an adjustable CTSD for phase alignment.

FIG. 7 illustrates an example of portions of an adjustable CTSD 700 for phase alignment. The adjustable CTSD 700 may be provided in an auxiliary path of a MASH converter such as described above, and it may include an adjustable ELD coefficient c0. The adjustable CTSD 700 may receive an input signal U (which may be filtered by an auxiliary prefilter) and convert the input signal to digital cancellation signal V. During the conversion, the adjustable CTSD 700 may also adjust the phase of the cancellation signal by tuning a group-delay of the CTSD 700 to align with the phase of the filtered signal from a prefilter of a MASH converter.

The adjustable CTSD 700 may include a main path, such as which includes an input coefficient b1 702, summing nodes 704, 710, an integrator 706, and a quantizer 718; a feedforward path, such as which includes a feedforward coefficient b0 708; and a feedback path, such as which includes a feedback coefficient c1 712, a delay 714, and an adjustable ELD coefficient c0 716.

The adjustable ELD coefficient c0 716 may be tuned, which in turn tunes the group-delay for phase alignment. Hence, adjusting the ELD coefficient c0 modifies the group-delay and thus the phase response of the CTSD 700. Again, the NTF of CTSD 700 may be represented as:

$$NTF(z) = \frac{1 - z^{-1}}{1 + (c0 - 1)z^{-1} + (c1 - c0)z^{-2}}$$

Therefore, adjusting the ELD coefficient c0 may also have an impact on the NTF of the CTSD 700.

The ELD coefficient c0 may be provided as a resistor DAC or a current DAC; these DACs may be adjusted accordingly to modify the group-delay of the CTSD.

Figure 8:
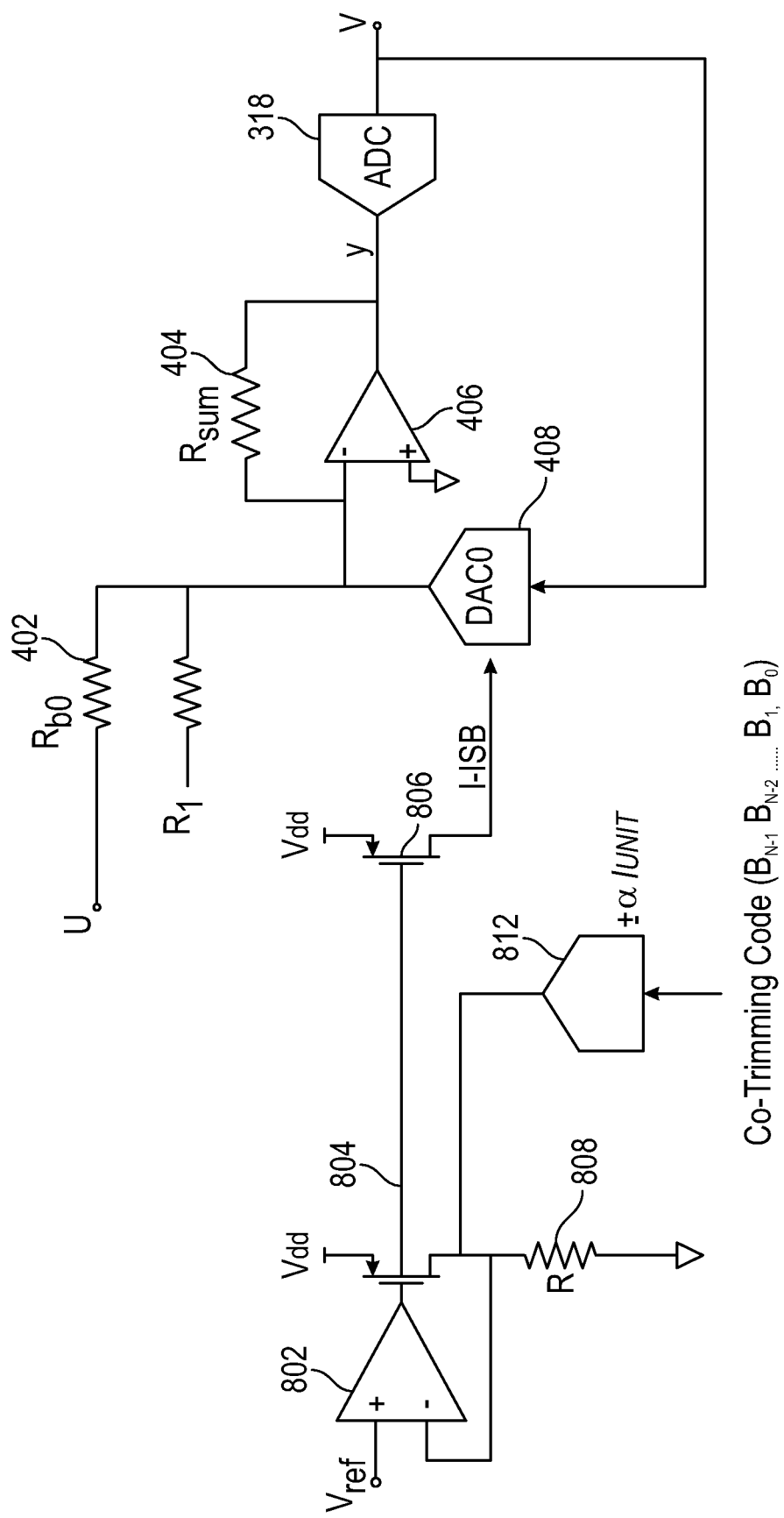
FIG. 8 illustrates an adjustable excess loop delay coefficient.

FIG. 8 illustrates an example of portions of an adjustable ELD coefficient c0. Here, the adjustable ELD coefficient c0 may be provided a driver 802 with Vref; a pair of (PMOS) transistors 804, 806; a resistor R 808; an adjustable current source (DAC) 812, and a current DAC 814. The adjustable current source 812 may generate a current, $\pm \alpha I_{unit}$. The I-DAC 814 may be controlled by a seed current $I_{LSD}$, which may be represented as:

$$ILSB = \frac{Vref}{R} \pm \propto Iunit$$

Hence, by adjusting the current of the adjustable current source 812, the value of the I-DAC 814 may be adjusted thereby modifying the value of the ELD coefficient c0.

Moreover, the clock timing of the CTSD may be adjusted to modify the group-delay of the CTSD to align phases of the filtered signal generated by a prefilter and a cancellation signal of generated by auxiliary path of a MASH converter. The CTSD may include an adjustable clock to adjust clock timing of the CTSD for phase alignment. The clock timing of the CTSD may be used, for example, by a quantizer (e.g., quantizer 318 or quantizer 718) therein.

Figure 9:
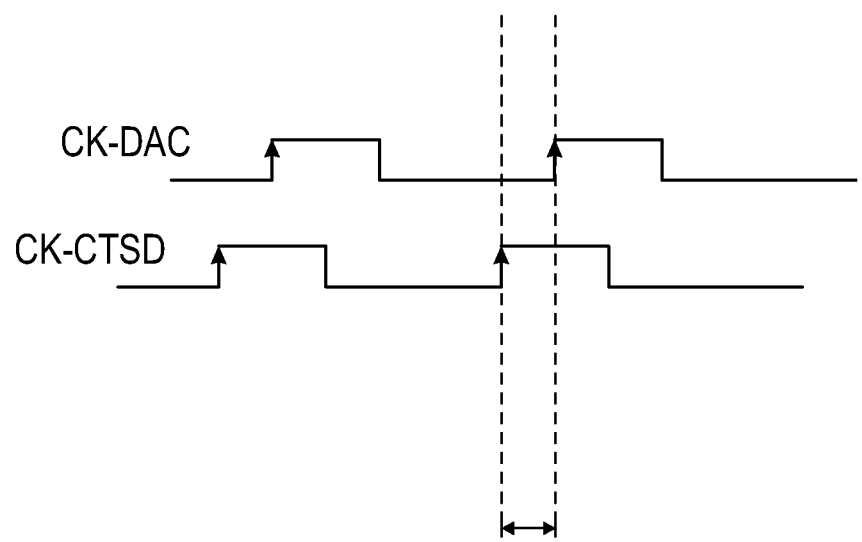
FIG. 9 illustrates an adjustable clock timing circuit.

FIG. 9 illustrates a clock timing diagram for phase alignment. The clock timing diagram may include a CK_DAC signal to a DAC in a CT-MASH converter, for example DAC 130 of FIG. 1 or DAC 230 of FIG. 2. Moreover, the clock timing diagram may include a clock signal CK_CTSD for an adjustable CTSD of a MASH converter, as described herein.

The CK_CTSD signal may be delayed or advanced for phase alignment. The delay or advancement of the CK_CTSD may be adjustable based on the phase mismatch, thereby adjusting the clock timing of the CTSD for phase alignment. For example, the CK_CTSD signal may be delayed or adjusted until it aligns with the next or preceding edge, respectively. The delay or advancement of the clock signal may be provided by an analog delay line, which may be programmed or adjusted based on the phase mismatch.

Figure 10:
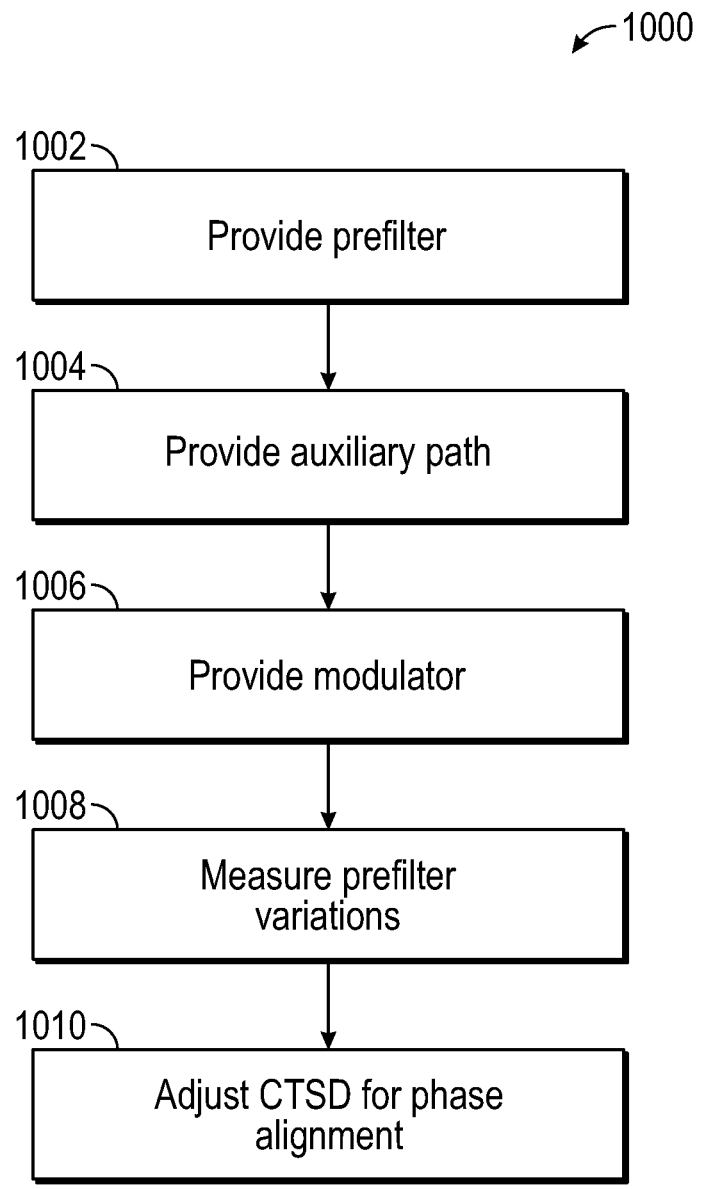
FIG. 10 is a flow diagram for aligning phases of signals in a MASH converter.

FIG. 10 illustrates a flow diagram of an example of portions of a method 1000 for aligning phases of signals in a MASH converter. The method 1000 may implemented using the MASH converters described herein. At 1002, a prefilter of MASH converter may be provided. The resistive and capacitive elements of the prefilter may be fabricated on a monolithic integrated circuit. At 1004, an auxiliary path of a MASH converter as described herein may be provided. The CTSD (and aux-prefilter, digital FIR filter, etc.) may be manufactured and coupled to the prefilter via a summing node as described herein. At 1008, a modulator (e.g., CIFB or CIFF modulator) may be provided. The integrators and other components of the modulator may be manufactured and coupled to the summing node as described herein.

At 1008, the variations of the prefilter may be measured. The prefilter may be provided as a lowpass RC filter that is subject to process variations. Therefore, the prefilter of the MASH converter may be monitored and its variations may be measured. For example, one or more test signals may be used to monitor or measure variations of the prefilter. Based on the monitored or measured variations, the CTSD in the auxiliary path may be adjusted to align phases of the signals from the prefilter (e.g., filtered signal) and the auxiliary path (e.g., cancellation signal). The CTSD may be adjusted using the techniques described herein. The group-delay of the CTSD may be adjusted by one or more of: tuning a feed-forward coefficient, by tuning an excess loop delay coefficient, and by adjusting a clock timing of the CTSD, as described herein.

The method 1000 may be performed at the time of manufacturing of the MASH converter. That is, the MASH converter may be calibrated by performing method 1000 after manufacturing and assembly of the parts of the MASH converter. The calibration may align the phases of the prefilter and auxiliary path stages of the MASH converter. After the calibration, the MASH converter may be operated without further adjustments to the auxiliary path (e.g., the CTSD) for phase alignment. Additionally or alternatively, the method 1000 may be performed at other times, too. For example, the method 1000 may be performed during operation of the MASH converter to dynamically align phases of the signals.

In other embodiments, other components in the auxiliary path may be adjusted for phase alignment. For example, the auxiliary prefilter (122, 222) and/or FIR (126, 226) may be adjusted for phase alignment as described herein.

Several embodiments of the invention are specifically illustrated and/or described herein. However, it will be appreciated that modifications and variations of the invention are covered by the above teachings and within the purview of the appended claims without departing from the intended scope of the invention.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

What is claimed is:

1. A multistage noise shaping (MASH) converter with phase alignment, the MASH converter comprising:
    a prefilter to filter an input signal to generate a filtered signal;
    an auxiliary path to generate a cancellation signal, the auxiliary path including an adjustable continuous time sigma delta (CTSD) converter, wherein the adjustable CTSD includes an adjustable group-delay for aligning a phase of the cancellation signal with a phase of the filtered signal;
    a summing node to generate a residue signal based on a difference of the filtered signal and the cancellation signal; and
    a modulator to quantize the residue signal and to generate an output signal.

2. The MASH converter of claim 1, wherein the adjustable CTSD further comprises:
    a main path;
    a feedback path; and
    a feedforward path including a feedforward coefficient tuned for aligning the phases of the cancellation signal and the filtered signal.

3. The MASH converter of claim 2, wherein the feedforward coefficient is defined by a network of resistances and switches coupled to an input of a summer and a feedback resistor.

4. The MASH converter of claim 3,
    wherein the network of resistances and switches includes two sets of resistors and switches,
    wherein the two sets are configured to selectively couple to two inputs of the summer.

5. The MASH converter of claim 1, wherein the adjustable CTSD further comprises:
    a main path;
    a feedforward path; and
    a feedback path for aligning the phases of the signal cancellation signal and the filtered signal.

6. The MASH converter of claim 5, wherein the feedback path includes an adjustable current digital-to-analog converter (DAC), and wherein a seed current of the current DAC is adjusted for aligning the phases of the signal cancellation signal and the filtered signal.

7. The MASH converter of claim 1, wherein the adjustable CTSD further comprises an adjustable clock to adjust clock timing of the CTSD for aligning the phases of the signal cancellation signal and the filtered signal.

8. The MASH converter of claim 1, wherein the modulator includes a cascade-of-integrators with feedback (CIFB) modulator.

9. The MASH converter of claim 1, wherein the modulator includes a cascade-of-integrators with feedforward (CIFF) modulator.

10. The MASH converter of claim 1, wherein the prefilter includes resistor and capacitive elements provided on a monolithic integrated circuit.

11. The MASH converter of claim 1, wherein an adjustment of the adjustable CTSD for aligning a phase of the signal cancellation signal with a phase of the filtered signal modifies a phase response of the adjustable CTSD without modifying a magnitude response of the adjustable CTSD.

12. The MASH converter of claim 1, wherein the auxiliary path further includes a filter.

13. The MASH converter of claim 1, wherein the auxiliary path further includes a digital finite impulse response (FIR) filter.

14. A method of converting an analog signal to a digital signal, the method comprising:
    filtering the analog signal to generate a filtered signal;
    generating a cancellation signal for phase alignment with the filtered signal, wherein generating the cancellation signal includes adjusting a group-delay for phase alignment;
    subtracting the cancellation signal from the filtered signal to generate a residue signal; and
    modulating the residue signal to generate the digital signal.

15. The method of claim 14, wherein the group-delay is based at least in part on variation of a filter used for filtering the analog signal to generate the filtered signal.

16. The method of claim 14, wherein the group-delay is adjusted using a network of resistances and switches defining a feedforward coefficient of a continuous time sigma delta (CTSD) converter.

17. The method of claim 14, wherein the group-delay is adjusted using a current DAC defining an excess loop delay coefficient of a continuous time sigma delta (CTSD) converter.

18. The method of claim 14, wherein the group-delay is adjusted by adjusting a clock timing of a continuous time sigma delta (CTSD) converter.

19. A method of tuning a multistage noise shaping (MASH) converter, the method comprising:
    providing a resistor capacitor (RC) filter in a prefilter path;
    providing an auxiliary path coupled to the prefilter path by a summer node;
    providing a modulator coupled to the summer node;
    measuring variations of the RC filter; and
    based on the measured variances, adjusting a continuous time sigma delta (CTSD) converter provided in the auxiliary path for aligning phase responses of the prefilter and auxiliary paths.

20. The method of claim 19, wherein adjusting the CTSD converter comprises tuning a feedforward coefficient of the CTSD.

21. The method of claim 20, wherein tuning the feedforward coefficient comprises selectively turning off at least one switch in a resistance network.

22. The method of claim 19, wherein adjusting the CTSD converter comprises tuning an excess loop delay coefficient of the CTSD.

23. The method of claim 22, wherein tuning the excess loop delay coefficient comprises adjusting a seed current of a current digital-to-analog converter (DAC).

24. The method of claim 19, wherein adjusting the CTSD converter comprises adjusting a clock timing of the CTSD.

* * * * *